(12) United States Patent
Jia et al.

(10) Patent No.: US 6,407,008 B1
(45) Date of Patent: Jun. 18, 2002

(54) METHOD OF FORMING AN OXIDE LAYER

(75) Inventors: Yingbo Jia, Fremont, CA (US);
Ohm-Guo Pan, Portland, OR (US);
Long-Ching Wang, Cupertino; Jeong Yeol Choi, Palo Alto, both of CA (US);
Guo-Qiang (Patrick) Lo, Portland;
Shih-Ked Lee, Hillsboro, both of OR (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/564,786

(22) Filed: May 5, 2000

(51) Int. Cl.[7] .............................................. H01L 21/314
(52) U.S. Cl. ...................... 438/773; 438/758; 438/769; 438/770; 438/774; 438/775
(58) Field of Search ................. 438/788, 770, 438/769, 773, 774, 775

(56) References Cited

U.S. PATENT DOCUMENTS

| | | | |
|---|---|---|---|
| 5,244,843 A | * 9/1993 | Chau et al. | 437/239 |
| 5,407,870 A | * 4/1995 | Okada et al. | 437/241 |
| 5,498,577 A | 3/1996 | Fulford, Jr. et al. | 437/228 |
| 5,512,519 A | * 4/1996 | Hwang | 437/242 |
| 5,674,788 A | * 10/1997 | Wristers et al. | 437/239 |
| 5,738,909 A | 4/1998 | Thakur et al. | 427/255.4 |
| 5,877,057 A | 3/1999 | Gardner et al. | 438/301 |
| 5,880,040 A | 3/1999 | Sun et al. | 438/769 |
| 5,882,993 A | 3/1999 | Gardner et al. | 438/591 |
| 5,970,350 A | 10/1999 | Gardner et al. | 438/287 |

FOREIGN PATENT DOCUMENTS

JP          07193059 A     *   7/1995    ......... H01L/21/314

* cited by examiner

Primary Examiner—Michael J. Sherry
Assistant Examiner—Lisa Kilday
(74) Attorney, Agent, or Firm—Marger Johnson & McCollom, P.C.

(57) ABSTRACT

Methods for forming nitrided oxides in semiconductor devices by rapid thermal oxidation, in which a semiconductor substrate having an exposed silicon surface is placed into a thermal process chamber. Then, an ambient gas comprising $N_2O$ and an inert gas such as argon or $N_2$ is introduced into the process chamber. Next, the silicon surface is heated to a predefined process temperature, thereby oxidizing at least a portion of the silicon surface. Finally, the semiconductor substrate is cooled. An ultra-thin oxide layer with uniform oxide characteristics, such as more boron penetration resistance, good oxide composition and thickness uniformity, increased charge to breakdown voltage in the oxide layer, can be formed.

21 Claims, 3 Drawing Sheets

METHOD OF FORMING AN OXIDE LAYER

BACKGROUND OF THE INVENTION

1. Field of the Invention

This invention relates to a method of manufacturing semiconductor devices and, ore particularly, to a method of forming an oxide layer on silicon using an ambient comprising $N_2O$.

2. Description of the Related Art

With the continuing scaling down of the feature size of semiconductor devices, the quality of ultra-thin oxides, such as gate dielectrics, has become more and more critical to the performance of the semiconductor devices. Further, advanced semiconductor devices require gate oxides less than 30 Angstroms (Å) thick. Oxides this thin are hard to control in conventional tube furnaces due to the difficulty of quickly supplying and removing oxygen from the system.

Rapid thermal processing (RTP) has been used to form quality ultra-thin oxides in MOSFET devices to avoid the problems of the conventional furnace processing. RTP technology is a natural choice for forming quality ultra-thin oxides because it can precisely control the oxide formation process. Rapid wafer heating and cooling, rapid gas switching, and high process temperature produce short oxidation cycles in RTP.

Additionally, oxides produced by RTP are known to possess a better oxide quality and a smoother $Si/SiO_2$ interface compared to conventional furnace processed oxides.

Another advantage of RTP is the lower thermal budget compared to conventional furnace processing. Thermal budget refers to the maximum acceptable diffusion of dopants in a semiconductor device containing doped regions. In manufacturing highly integrated semiconductor devices, the regions of dopants in the wafer must be precisely controlled. For example, dopant diffusion must be limited to maintain shallow junctions vertically and horizontally. In conventional furnace processes, dopant diffusion is difficult to control because the process is performed at high temperatures for relatively long periods of time.

Different ambient gases have also been tried. For example, pure $O_2$ and wet $O_2$ (steam mixed with $O_2$) have been used as an oxidation ambient in the formation of oxide. In pure $O_2$ and wet $O_2$ based-oxides, however, the migration of dopants, particularly boron, from an overlying polysilicon layer down through the oxide to the channel, has caused the degradation of device performance by altering the doping profile of the channel region.

More recently, $N_2O$ has been used as an oxidation ambient because, compared to pure $O_2$ and wet $O_2$ based-oxides, $N_2O$-based nitrided oxides are found to be a better barrier against boron penetration from the polysilicon gate into the channel region of MOSFET devices. Further, $N_2O$-based nitrided dielectrics are known to provide relatively fine oxide reliability. Also, higher charge-to-breakdown and better hot carrier immunity can be obtained in $N_2O$-based nitrided oxides.

For these reasons, RTP systems utilizing atmospheres containing $N_2O$ have been studied as a way to obtain high-quality oxides. For example, U.S. Pat. No. 5,882,993 utilizes rapid thermal anneal in an atmosphere of $N_2O/NH_3/O_2/HCl$, or $N_2O/O_2/HCl$, or $NO/O_2/HCl$ for gate oxide formation. Also, U.S. Pat. No. 5,880,040 discloses a two-step RTP with a first oxidation step in $N_2O$ and a second step in NO ambient.

However, there have been drawbacks to these conventional processes. First, non-uniformity is often found in oxides grown in pure $N_2O$. Second, as oxides grown in $N_2O$ and $O_2$ gas mixture become thinner, as required by deep sub-micron MOSFET devices, boron can penetrate through the oxide layer. Thus, further improvement in this respect is needed. Third, in the case of RTP requiring multiple-step processes, the processes are more complex and it is difficult to control the thickness of an oxide layer and its uniformity. Also, more steps usually mean an increase in processing cycle time and lower throughput. Fourth, when $NH_3$ is used in the oxidation ambient, $NH_3$ can introduce raps in the oxides that cause degradation in device performance.

Accordingly, there is still a need for improvement in forming ultra-thin oxides with high quality oxide characteristics such as more resistance to the penetration of dopants such as boron and increased charge-to-breakdown.

SUMMARY OF THE INVENTION

It is, therefore, an object of the invention to improve the quality of an ultra-thin oxide layer and to improve the formation methods thereof.

In accordance with the present invention, a semiconductor substrate having an exposed silicon surface is placed into a thermal process chamber. Then, an ambient gas comprising $N_2O$ and an inert gas such as argon or $N_2$ is introduced into the process chamber. Next, the semiconductor surface is heated to a predefined process temperature to oxidize at least a portion of the exposed silicon surface. Finally, after a predefined process time, the semiconductor substrate is cooled.

Preferably, the heating step comprises rapid thermal oxidation.

In another embodiment of the present invention, an oxidation ambient gas further includes $O_2$.

In accordance with the present invention, more nitrogen can be incorporated in the ultra-thin oxide layer, thereby allowing more boron penetration resistance. Also, better oxide characteristics, such as uniform oxide composition and thickness uniformity, and increased charge-to-breakdown in the oxide layer, can be achieved in the present invention compared to the conventionally processed thin oxides.

The foregoing and other objects, features and advantages of the invention will become more readily apparent from the following detailed description of a preferred embodiment of the invention that proceeds with reference to the accompanying drawings.

DETAILED DESCRIPTION

The present invention can be used for forming any kind of thin oxides on silicon, for example, gate and capacitor dielectrics or poly re-oxidation oxidizing the gate corner.

Figure 1:
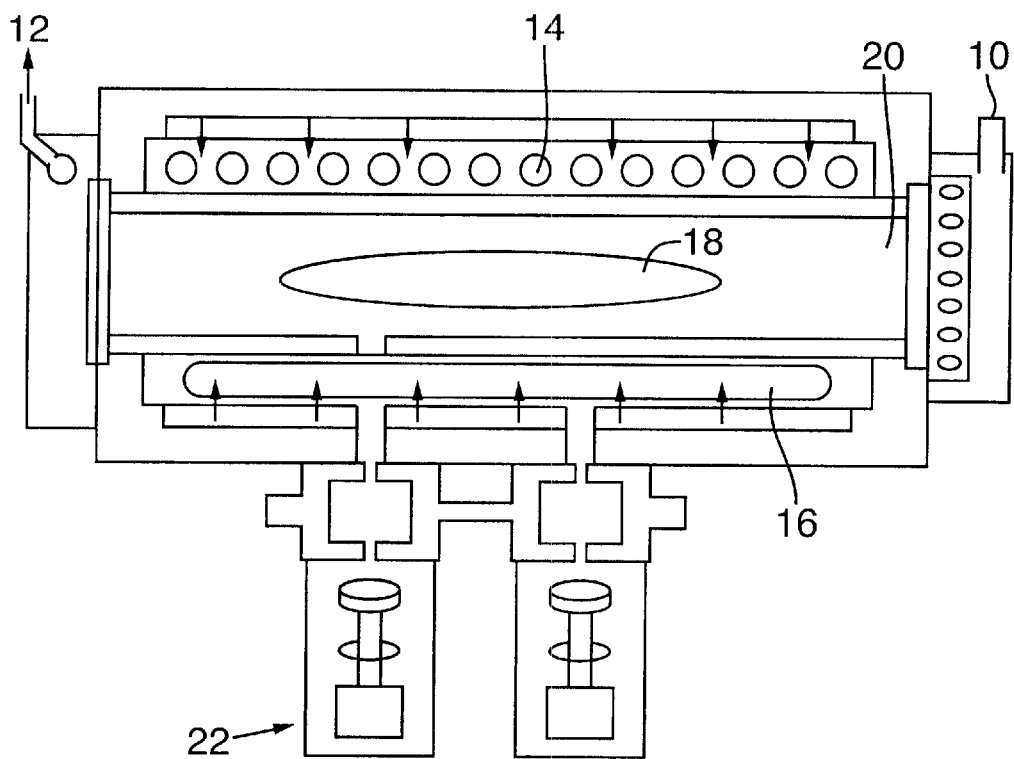
FIG. 1 is a schematic diagram of the rapid thermal process chamber used for the present invention.

FIG. 1 illustrates one of a wide variety of rapid thermal process chambers that can be used for the present invention. Although die present invention can be implemented using conventional furnaces, since RTP technology has more advantages compared to conventional furnaces technology, a rapid thermal process chamber, such as commercially available AG Associates HEATPULSE 8800, is preferably used for the present invention. The process chamber is fitted with gas inlet 10 and exhaust outlet 12. Inside, heat sources 14 and 16, such as tungsten halogen lamps, above and below wafer 18, provide rapid heating. Gas sources (not shown) are coupled to the rapid thermal chamber 20 through gas inlet 10.

In the present invention, the processing chamber can be purged with $N_2$. The to-be-processed silicon substrate, e.g., a wafer, is then introduced into the process chamber.

Next, an ambient gas is introduced into the process chamber. Preferred embodiments of the ambient gases and gas ratios used for the present invention are shown in Table I.

Table I lists die growth methods used in accordance with the present invention: (1) RTO, grown in $O_2$; (2) RTN, grown in mixture of $N_2O$ and $O_2$; and (3) DRTN (diluted RTN), grown in mixture of $N_2O$, $O_2$ and $N_2$.

TABLE 1

Examples of growth methods and oxidation ambient gases

| Method | Oxidation ambient gases | Gas ratios |
|---|---|---|
| RTO | $O_2$ | $N_2O:O_2:N_2 = 0:1:0$ |
| RTN | $N_2O/O_2$ | $N_2O:O_2:N_2 = 1:2:0$ |
| RTN | $N_2O/O_2$ | $N_2O:O_2:N_2 = 2:1:0$ |
| DRTN | $N_2O/O_2/N_2$ | $N_2O:O_2:N_2 = 1:2:10$ |
| DRTN | $N/_2O/O_2/N_2$ | $N_2O:O_2:N_2 = 2:1:10$ |
| DRTN | $N/_2O/O_2/N_2$ | $N_2O:O_2:N_2 = 2:0:10$ |

As can be seen in Table I, ambient gases can be comprised of $N_2O$ and an inert gas. Preferably, the ambient gas includes $N_2O$: an inert gas in an approximate volume ratio of 2:10.

In one embodiment of the present invention, the inert gas comprises up to 95 percent by volume of the ambient gas. Also, $N_2O$ can comprise up to 25 percent by volume of the ambient gas. The inert gas can be a noble gas and $N_2$. Preferably, the noble gas is argon.

According to a preferred embodiment, an ambient gas further comprises $O_2$. Preferably, $O_2$ comprises approximately up to 25 percent by volume of the ambient gas. More preferably, the ambient gas includes $N_2O:O_2:N_2$ in an approximate volume ratio of 1:2:10. Also, the ambient gas may include $N_2O:O_2:N_2$ in an approximate volume ratio of 2:1:10.

Also, an ambient gas may be a mixture of $N_2O$ and $O_2$ having a range of approximately 2:1 to 1:2. Then, the mixture of $N_2O$ and $O_2$ is diluted by an inert gas in a ratio of about 1:3.

The process chamber pressure is preferably maintained at atmospheric pressure during oxidation.

Figure 2:
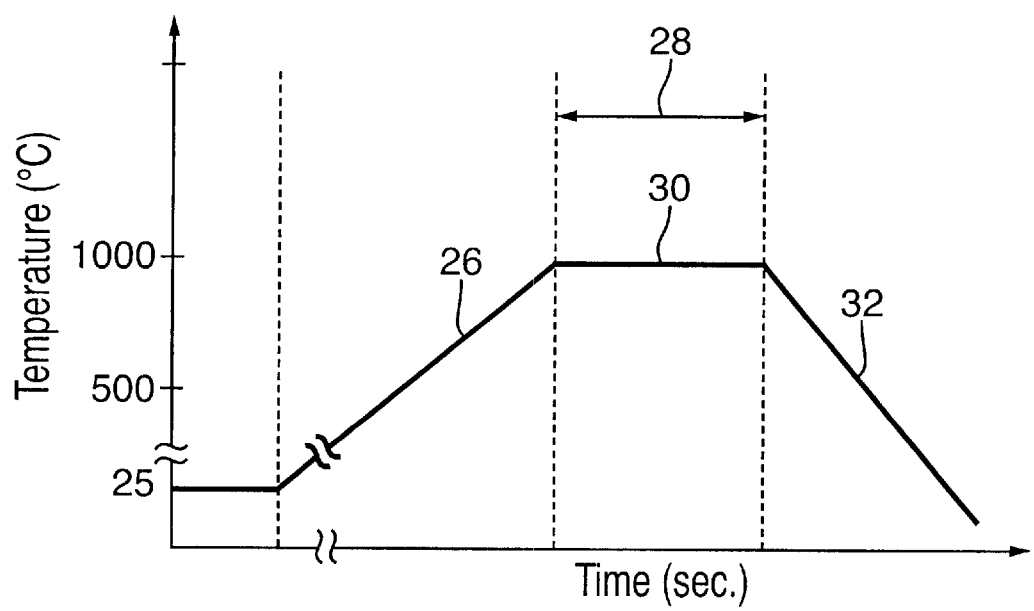
FIG. 2 is a diagram illustrating the temperature versus time profile in accordance with the present invention.

Next, the exposed wafer surface is heated to a predefined process temperature as depicted in FIG. 2, where the vertical axis indicates the temperature of the wafer surface. The temperature is measured by use of a DTC (direct thermal couple). Alternately, the temperature may be measured by optical pyrometer 22 shown in FIG. 1.

FIG. 2 depicts the preferred temperature versus time of the process according to one embodiment of the present invention. Heating step 26 shown in FIG. 2 is performed at a rate of higher than or equal to 20° C. per second, limited by lamp power, until a predefined process temperature is attained. Heating step 26 can be performed at a rate of between approximately 20° C. to approximately 200° C. per second until the predefined process temperature is attained. Preferably, the heating step 26 is performed at a rate of approximately 55° C. per second. A faster ramp rate is preferred because oxides grown during ramp up are known to have lower quality due to low temperature growth.

In one embodiment, the predefined process temperature is in the range of approximately 850° C. to approximately 1050° C.

The predefined process temperature is, preferably in a steady state 30, substantially maintained for a predefined period 28 of between approximately five to approximately thirty seconds. Accordingly, at least a portion of the exposed wafer surface is oxidized. The process temperature and time can be modified depending on oxide thickness and gas ratio.

Then, the oxidation ambient is removed from the chamber.

Finally, the semiconductor substrate is cooled. Preferably, the cooling step 32 is performed at a rate of between approximately 20° C. to approximately 100° C. per second. More preferably, the cooling step 32 is performed at a rate of approximately 30° C. per second. During the cooling step 32, the chamber is filled with $N_2$. When the temperature is below 300° C., the semiconductor substrate can be removed from the chamber.

Figure 3:
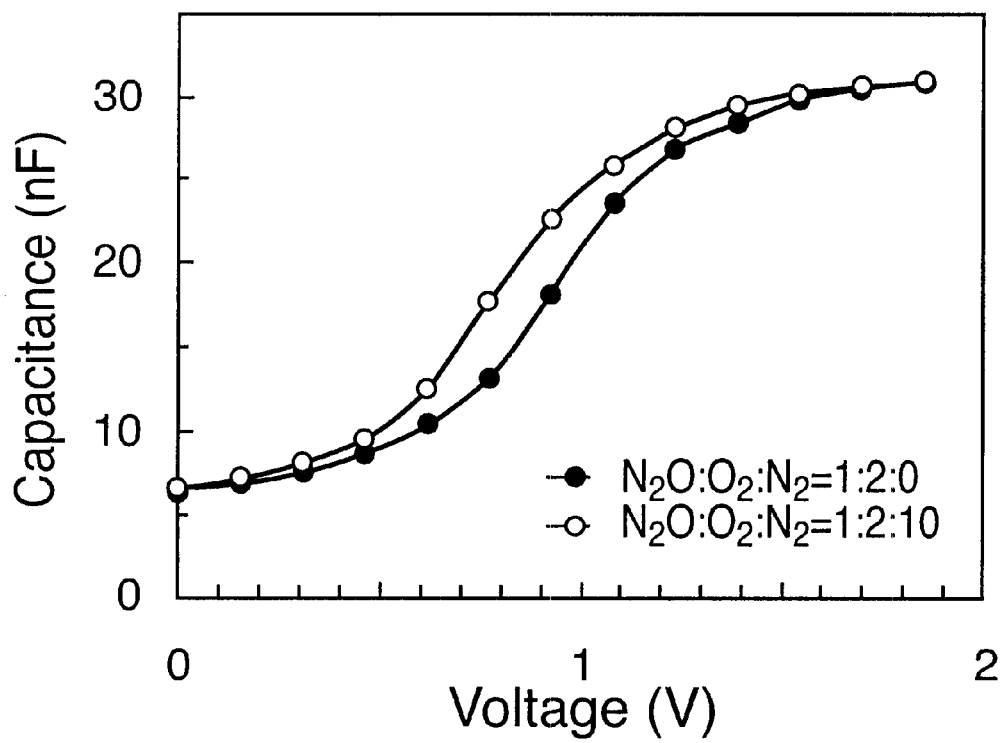
FIG. 3 shows C-V curves of two processes with and without an inert gas such as $N_2$ in an oxidation ambient.
Figure 4:
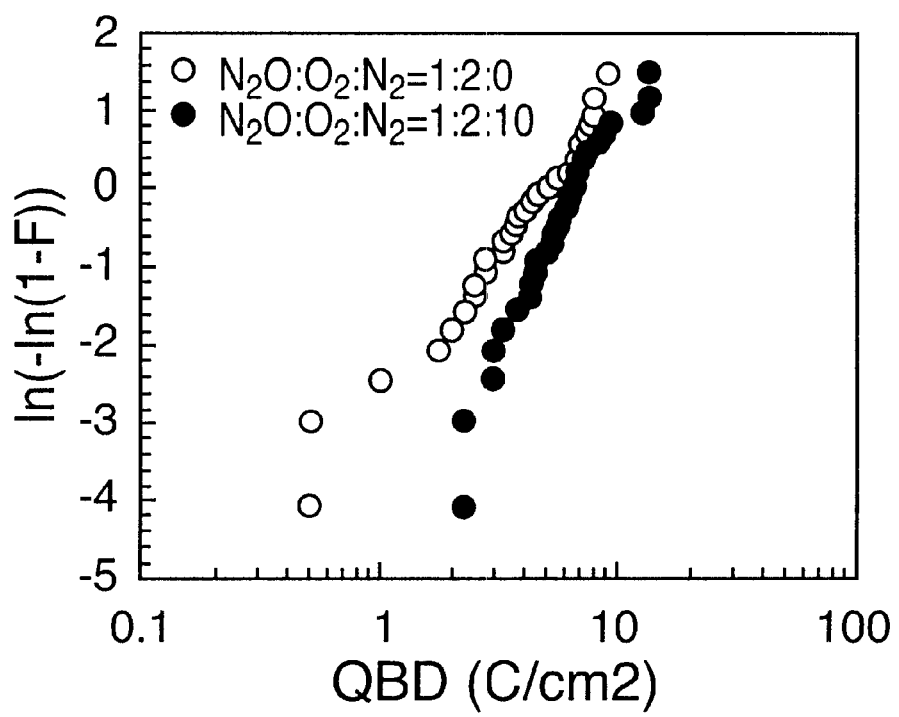
FIG. 4 is a graph comparing $Q_{BD}$ (charge-to-breakdown) data of oxides prepared by two different processes with or without an inert gas in an oxidation ambient; i.e., (Rapid Thermal Process with Diluted ambient—DRTN) or (Rapid Thermal Nitridation—RTN).
Figure 5:
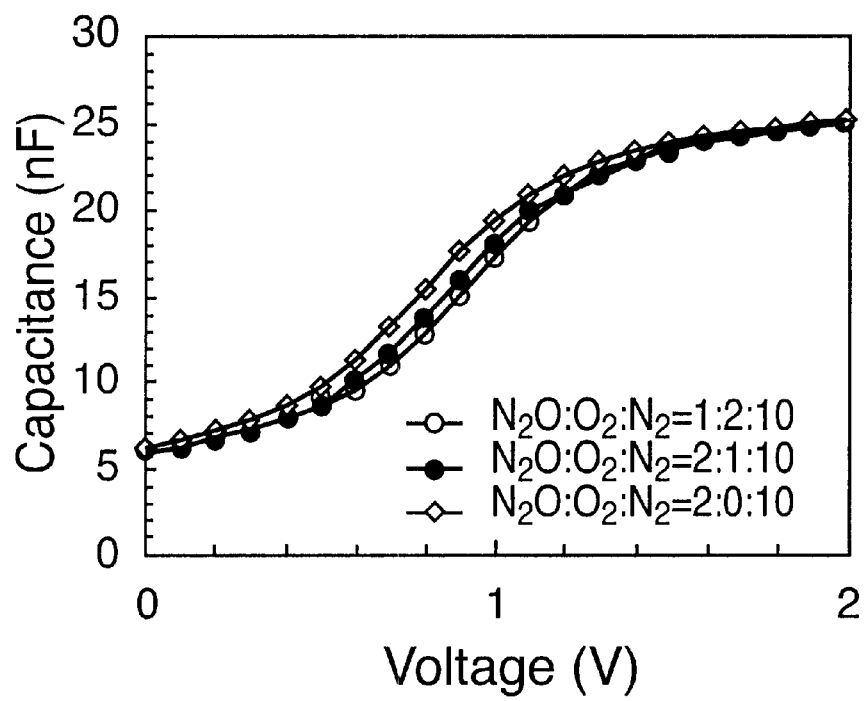
FIG. 5 is a graph comparing C-V curves for DRTN with three different gas ratios to verify the results of the present invention.

FIGS. 3–5 illustrate the results of experiments verifying the improvement achieved by the present invention. For the purpose of generating the data illustrated in FIGS. 3–5, MOS capacitors were fabricated for electrical characterization. Oxide thickness was 34 Å for all processes. The substrates were n-type Si wafers with n-well implant. $P^+$ polysilicon was used as a gate material. Charge-to-breakdown ($Q_{BD}$) was measured by constant current of five nanoamps/square micrometer ($nA/\mu m^2$). C-V curves were also measured and calculated.

FIG. 3 presents C-V curves of two processes with and without an inert gas such as $N_2$ in the ambient. The difference in these two C-V curves indicates less boron penetration through oxide grown in ambient containing an inert gas. Particularly, higher nitrogen incorporation prevents boron penetration from p type poly gate into channel region of a PMOSFET. In the present invention, by adding an inert gas to $N_2O$ oxidation ambient during the oxidation step, higher process temperatures could be used because oxide growth rate become lower compared to the ambient without an inert gas. The higher process temperature results in higher nitrogen incorporation which offers better boron penetration resistance compared to the processes without an inert gas in the oxidation ambient.

FIG. 4 shows $Q_{BD}$ data of two processes with and without an inert gas in the ambient. Higher $Q_{BD}$ could be obtained for the process containing an inert gas in the oxidation ambient, thus improving the reliability of oxides.

FIG. 5 shows C-V curves of DRTN processed with three different gas ratios. The C-V curve sifts for processes with different $N_2O$ gas ratios indicate that more nitrogen incorporation provides more effective resistance to boron penetration. Compared to oxides grown in pure $N_2O$ where non-uniformity is a problem for gate oxidation, with the oxides formed using an $N_2O$ oxidation ambient diluted by $N_2$, higher process temperature for the same oxide thickness is achieved, thereby attaining better oxide quality. The higher process temperature (thus, the lower oxide growth) is observed in the oxides formed using $N_2O$ diluted by $N_2$ even compared to a mixture of $N_2O$ and $O_2$ diluted by an inert gas.

Conclusion

Figure 6:
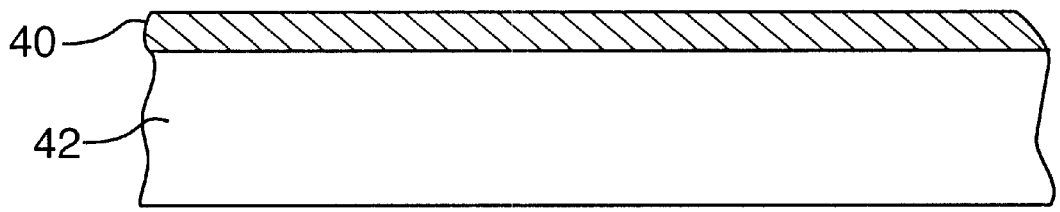
FIG. 6 is a cross-sectional view of a semiconductor wafer undergoing the process of the present invention to form a thin oxide layer on a silicon substrate.

In the present invention, ultra-thin oxide layers are formed with improved oxide characteristics by diluting $N_2O$ or a mixture of $N_2O$ and $O_2$ oxidation ambient gases with an inert gas such as argon or $N_2$. Thus, in the present invention, an ultra-thin oxide layer 40 with good oxide characteristics, such as, more boron penetration resistance, good oxide uniformity, increased charge-to-breakdown, is formed on the exposed silicon surface of substrate 42, as shown in FIG. 6.

Having described and illustrated the principles of die invention in a preferred embodiment thereof, it should be apparent that the invention can be modified in arrangement and detail without departing from such principles. I claim all modifications and variation coming within the spirit and scope of the following claims.

We claim:

1. A method of forming an oxide layer on a semiconductor substrate, the method comprising:

providing a semiconductor substrate having an exposed silicon surface;

placing the semiconductor substrate into a thermal process chamber;

introducing an ambient gas into the process chamber, said ambient gas comprising a mixture of $N_2O$, $O_2$, and an inert gas;

heating the silicon surface to a process temperature to oxidize at least a portion of the silicon surface, and after a process time, cooling the semiconductor substrate.

2. The method of claim 1, wherein said inert gas comprises up to 95 percent by volume of said ambient gas.

3. The method of claim 1, wherein $N_2O$ comprises up to 25 percent by volume of said ambient gas.

4. The method of claim 1, wherein said inert gas is selected from the group consisting of a noble gas and $N_2$.

5. The method of claim 4, wherein said noble gas is argon.

6. The method of claim 4, wherein said ambient gas includes $N_2O:N_2$ in an approximate volume ratio of 2:10.

7. The method of claim 1, wherein said heating step comprises rapid thermal oxidation.

8. The method of claim 7, wherein said process temperature is in the range of approximately 850° C. to approximately 1050° C.

9. The method of claim 7, wherein said heating step is performed at a rate of higher than or equal to approximately 20° C. per second until said process temperature is attained.

10. The method of claim 7, wherein said heating step is performed at a rate of between approximately 20° C. to approximately 200° C. per second until said process temperature is reached.

11. The method of claim 10, wherein said heating step is performed at a rate of approximately 55° C. per second.

12. The method of claim 7, wherein said process time is between approximately 5 to approximately 30 seconds.

13. The method of claim 7, wherein said cooling step is performed at a rate of between approximately 20° C. to approximately 100° C. per second.

14. The method of claim 13, wherein said cooling step is performed at a rate of approximately 30° C. per second.

15. The method of claim 1, wherein said $O_2$ comprises approximately up to 25 percent by volume of said ambient gas.

16. The method of claim 1, wherein said ambient gas includes $N_2O:O_2:N_2$ in an approximate volume ratio of 1:2:10.

17. The method of claim 1, wherein the ambient gas includes $N_2O:O_2:N_2$ in an approximate volume ratio of 2:1:10.

18. The method of claim 1, wherein said mixture of $N_2O$ and $O_2$ has a range of between approximately 2:1 and 1:2 and said mixture of $N_2O$ and $O_2$ is diluted by said inert gas in a ratio of approximately 1:3.

19. A method of forming an oxide layer on a semiconductor substrate, the method comprising:

providing a semiconductor substrate having an exposed silicon surface;

placing the semiconductor substrate into a thermal process chamber;

introducing an ambient gas into the process chamber, said ambient gas comprising $N_2O$ diluted by a gas selected from the group consisting essentially of:

argon, $N_2$, a mixture of $O_2$ and $N_2$, a mixture of $O_2$ and argon, and a mixture of $O_2$, argon, and $N_2$;

heating the silicon surface to a process temperature by rapid thermal oxidation to oxidize at least a portion of the silicon surface, wherein said ambient gas includes $N_2O:O_2:N_2$ or argon in an approximate volume ratio of 1:2:10 or 2:1:10, and after a process time, cooling the semiconductor substrate.

20. The method of claim 18, wherein said heating step is performed at a rate of approximately 55° C. per second until said process temperature is obtained, wherein said process temperature is in the range of approximately 850° C. to approximately 1050° C., and wherein said cooling step is performed at a rate of approximately 30° C. per second.

21. The method of claim 19, wherein said process time is between approximately 5 to approximately 30 seconds.

\* \* \* \* \*